(12) United States Patent
Kobayashi et al.

(10) Patent No.: US 6,575,351 B1
(45) Date of Patent: Jun. 10, 2003

(54) WORK/HEAD POSITIONING APPARATUS FOR BALL MOUNT APPARATUS

(75) Inventors: Shigeharu Kobayashi, Ishikawa (JP); Hiroshi Konaka, Ishikawa (JP)

(73) Assignee: Shibuya Kogyo Co., Ltd., Ishikawa (JP)

( * ) Notice: Subject to any disclaimer, the term of this patent is extended or adjusted under 35 U.S.C. 154(b) by 0 days.

(21) Appl. No.: 09/597,424

(22) Filed: Jun. 19, 2000

(30) Foreign Application Priority Data

| Jun. 18, 1999 | (JP) | 11-172002 |
| Jun. 23, 1999 | (JP) | 11-177523 |
| Jun. 23, 1999 | (JP) | 11-177524 |
| Jun. 30, 1999 | (JP) | 11-186091 |
| Jul. 9, 1999 | (JP) | 11-195690 |

(51) Int. Cl.⁷ ............................................ B23K 35/14
(52) U.S. Cl. ........................................ 228/207; 228/246
(58) Field of Search ........................... 228/256, 207, 228/6.2, 45, 49.1, 56.5, 248.1, 180.22, 41, 245, 246; 29/840, 740

(56) References Cited

U.S. PATENT DOCUMENTS

| 5,090,609 A | * | 2/1992 | Nakao et al. |
| 5,445,313 A | * | 8/1995 | Boyd et al. |
| 5,626,277 A | * | 5/1997 | Kawada |
| 6,149,047 A | * | 11/2000 | Oda |
| 6,284,568 B1 | * | 9/2001 | Yamamoto |

FOREIGN PATENT DOCUMENTS

| JP | 10032225 A | 2/1998 |
| JP | 10058241 A | 3/1998 |
| JP | 10261675 A | 9/1998 |
| JP | 11087419 A | 3/1999 |
| JP | 2000040709 A | 2/2000 |
| JP | 2000077460 A | 3/2000 |

* cited by examiner

Primary Examiner—Tom Dunn
Assistant Examiner—Jonathan Johnson
(74) Attorney, Agent, or Firm—Sughrue Mion, PLLC

(57) ABSTRACT

A work and head positioning apparatus, a flux reservoir a mount head and a transfer head are disclosed for a ball mount apparatus. In the work and head positioning apparatus, a head driving mechanism drives a head substantially in a linear direction, a first work driving mechanism drives extending in a direction intersecting the drives a work, and a second work driving mechanism drives the work in a rotational direction on the first work driving mechanism. In a flux reservoir, a flat supply area in a flux reserving space is made substantially as large as a transfer area of a transfer head, and is made movable up relatively to the flux reserving space except the flat supply area while keeping substantial parallelism between the flux provided on the flat supply area and the transfer area of the transfer head.

9 Claims, 11 Drawing Sheets

WORK/HEAD POSITIONING APPARATUS FOR BALL MOUNT APPARATUS

BACKGROUND OF THE INVENTION

1. Field of the Invention

The present invention relates to improvements of a work/head positioning apparatus, a flux reservoir, a mount head and a transfer head to be respectively used in a ball mount apparatus for mounting solder balls, solder bumps, or the like, on a wafer or a substrate.

The present application is based on Japanese Patent Applications No. Hei. 11-172002, 11-177523, 11-177524, 11-186091 and 11-195690, which are incorporated herein by reference.

2. Description of the Related Art

A background-art solder ball mount apparatus had also a driving mechanism which could be used for positioning three axes such as X-, Y- and Θ-axes provided on the work side regardless of the existence of a driving mechanism which was provided in a mount head, a flux transfer head, or the like, for use for performing positioning. Provision of such a multi-axial driving mechanism however resulted in mechanical complexity and consequently in increasing factors of trouble.

Further, in a flip chip bonder, a ball mount apparatus, or the like, in the background art, an apparatus for transferring flux to a work was used. In such an apparatus, a bonding head which holds a work was moved down to a flux reservoir so that flux was transferred to the work, or a transfer head was moved down to a flux reservoir so that flux adhering to the transfer head was transferred again to a desired work.

In such a flux reservoir 10 (flux supply unit), the thickness of a flux layer 440 in a flux reserving space 14 is smoothed by a squeegee 15 in order to transfer uniform flux to a work or a transfer head 13. If the flux layer 440 is smoothed by the squeegee 15, flux protuberances 441 and 442 are produced at edge portions of the flux layer 440 as shown in FIGS. 23 and 24. There is less problem even if such protuberances 441 and 442 are produced in the case where flux is transferred all over the work. However, in the case where flux is transferred to the transfer head 13, there arises a danger of applying flux to unexpected portions of the transfer head 13 due to the protuberances 441 and 442 as shown in FIG. 24.

There occurs no serious problem in the case where a transfer head has large transferring protrusion portions as in the background art. However, such transferring protrusion portions have been reduced in size and increased in density with the recent development of very small chips. Accordingly, there is a possibility that a problem may occur. In order to avoid such a problem, it is possible to prevent flux from rising if the area smoothed by the squeegee is increased. In this case, however, the flux reservoir becomes large undesirably in the case where transferring is performed on a large area at a time, for example, so as to transfer flux to a wafer in a lump.

Still further, in a background-art solder ball mount apparatus, the position of a mount head or a flux transfer head was fixed, and the position of a work was adjusted to coincide with that of the head so as to position the head and the work. Therefore, there was no position recognizing means on the head side, and there was only means for recognizing the position of the work. However, with the recent tendency to make balls very small and mount a large quantity of balls in a lump, there was a jump in required positioning accuracy. As a result, the mount quality could not be ensured if the positions of the head and the work were recognized in such a background-art method.

Still further, in a mount head for sucking solder balls in a background-art solder ball mount apparatus, a large number of suction holes for sucking solder balls were provided in a vacuum plate disposed on the lower surface of the mount head. The mount head was decompressed by vacuum means so as to suck solder balls in the suction holes. Then, the mount head was moved above a work so as to mount the solder balls on the work.

When solder balls or the like were mounted on a work, it was essential to keep proper parallelism between the vacuum plate and the work in order to make the mount head mount solder balls or the like on the work accurately. Particularly when a large quantity of solder balls or the like were mounted on the work, it was important to ensure such parallelism. However, the vacuum plate was often distorted due to the tendency to make the vacuum plate thinner or other reasons, so that it was difficult to keep proper parallelism between the vacuum plate and the work.

Still further, in a background-art solder ball mount apparatus, there was a transfer head using a screen, that is, a transfer head in which a film-like (plate-like or sheet-like) screen provided with protrusions on its lower surface was strained with a tension, as a new system for transferring a very small amount of flux onto a wide area. In this system, however, there occurred such a phenomenon that a screen 238 was bent at its center portion when the transfer head was pressed onto a flux supply portion 16 as shown in FIG. 22. Accordingly, there was a problem that a difference appeared in flux adhering quantity between the center and the circumference of the transfer head.

SUMMARY OF THE INVENTION

Generally, a driving mechanism which could be used for positioning at least one axis for horizontal movement other than a lifting axis (Z-axis) was provided also in a mount head or the like also in a background-art solder ball mount apparatus. According to the present invention, paying attention to this fact, in order to solve the foregoing problem, it is a first object of the present invention to provide a solder ball mount apparatus in which a driving axis for driving a mount head or the like is used as a positioning driving axis so that excessive driving axes are reduced in the solder ball mount apparatus as a whole and a driving mechanism is made simple. As a result, factors of trouble are reduced.

It is a second object of the present invention to provide a flux reservoir and a flux transferring method in which flux does not adhere to any unexpected portion of a transfer head, so that transferring can be performed surely even if the flux reservoir is compact in size and transferring is very fine.

It is a third object of the present invention to provide a ball mount apparatus with a positioning apparatus and a positioning method. Positioning alignment marks are provided also on a head side, and both the positions of the head and work are recognized. The head and work are positioned on the basis of the results of the recognition. Thus, it is made possible to satisfy the high positioning accuracy required with the recent tendency to make balls very small and to mount a large quantity of balls in a lump.

It is a fourth object of the present invention to provide a mount head in a ball mount apparatus in which parallelism is ensured between a work and a vacuum plate so that a large quantity of solder balls can be mounted on the work accurately.

It is a fifth object of the present invention to provide a transfer head in which such a phenomenon that a screen is bent at its center portion is not produced even when the transfer head is pressed onto a flux supply portion, so that there does not appear a difference in flux adhering quantity between the center and the circumference of the transfer head, and the flux adhering quantity can be made uniform.

According to a first aspect of the present invention, there is provided a work and head positioning apparatus to be provided in a ball mount apparatus, the work and head positioning apparatus moving a work and a head relatively to each other to perform positioning of the head and the work, comprising:

a head driving mechanism for driving the head substantially in a linear direction;

a first work driving mechanism for driving the work, the first work driving mechanism extending in a direction intersecting the driving mechanism; and a second work driving mechanism for driving the work in a rotational direction on the first work driving mechanism, wherein the three driving mechanisms are driven so that a positional relationship between the work and the head is adjusted.

According to a second aspect of the present invention, there is provided a flux reservoir comprising:

a main body;

a flux reserving space provided on the main body, and the flux reserving space having a flat supply area for transferring flux to a transfer head; and a squeegee for smoothing a flux provided in the flux reserving space so the flux is provided on at least a whole of the flat supply area, wherein the flat supply area in the flux reserving space is made substantially as large as a transfer area of the transfer head, and is made movable up relatively to the flux reserving space except the flat supply area while keeping substantial parallelism between the flux provided on the flat supply area and the transfer area of the transfer head.

According to a third aspect of the present invention, there is provided a work and head positioning apparatus to be provided in a ball mount apparatus, comprising:

an alignment mark provided in a head;

first optically recognizing means for recognizing the alignment mark;

second optically recognizing means for recognizing a position of a work;

operation means for carrying out an operation for obtaining a quantity of a relative positional gap between the head and the work based on a recognition result of the first and second optically recognizing means; and control means for giving movement instructions to a driving mechanism for driving respective axes of the head and the work based on a result of the operation means.

According to a fourth aspect of the present invention, there is provided a mount head to be used in a ball mount apparatus, comprising:

a main body;

a vacuum plate having a large number of suction holes for sucking balls and disposed on a lower portion of the main body;

a gas-conducting path forming member disposed in the main body and above the vacuum plate to support the vacuum plate against external force, the gas-conducting path forming member having gas conducting paths which do not correspond to the suction holes of the vacuum plate; and a gas conducting permeable member disposed between the vacuum plate and the gas-conducting path forming member.

According to a fifth aspect of the present invention, there is provided a transfer head comprising:

a main body having a frame on a lower surface thereof;

a screen having transfer protrusions provided on a lower surface thereof, the screen being strained with a tension over the frame; and urging means being disposed above the screen, the urging means giving no force to the screen in a no-load state but urging the screen downward when an upward load is given to the screen.

Features and advantages of the invention will be evident from the following detailed description of the preferred embodiments described in conjunction with the attached drawings.

DETAILED DESCRIPTION OF THE PREFERRED EMBODIMENTS

Figure 1:
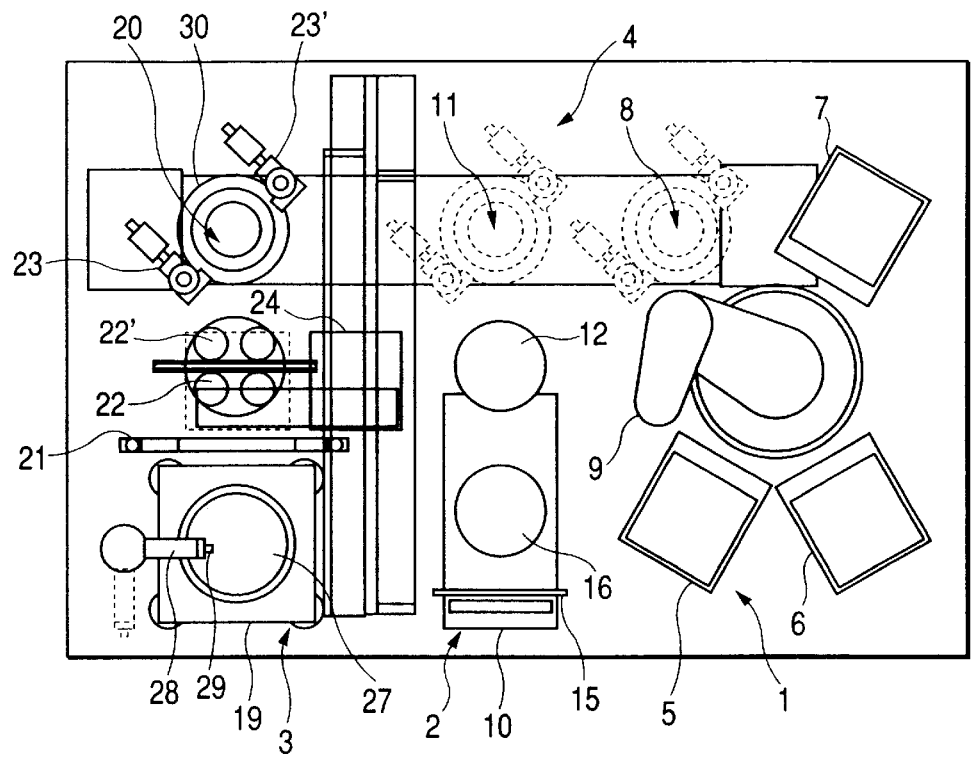
FIG. 1 shows a plan view of a solder ball mount apparatus.

Description will be made below about the mode for carrying out the invention along embodiments with reference to the drawings. FIG. 1 is a plan view of a solder ball mount apparatus according to an embodiment. The solder ball mount apparatus is constituted by a wafer supply portion 1, a flux transfer portion 2, a ball mount portion 3 and a work driving mechanism 4.

The wafer supply portion 1 is constituted by respective wafer cassettes, that is, a supply wafer cassette 5, an outgoing wafer cassette 6 and a reject wafer cassette 7, a clean-room scholar robot 9 for conveying a wafer 49, and a wafer positioning position 8 on the work driving mechanism 4.

Figure 2:
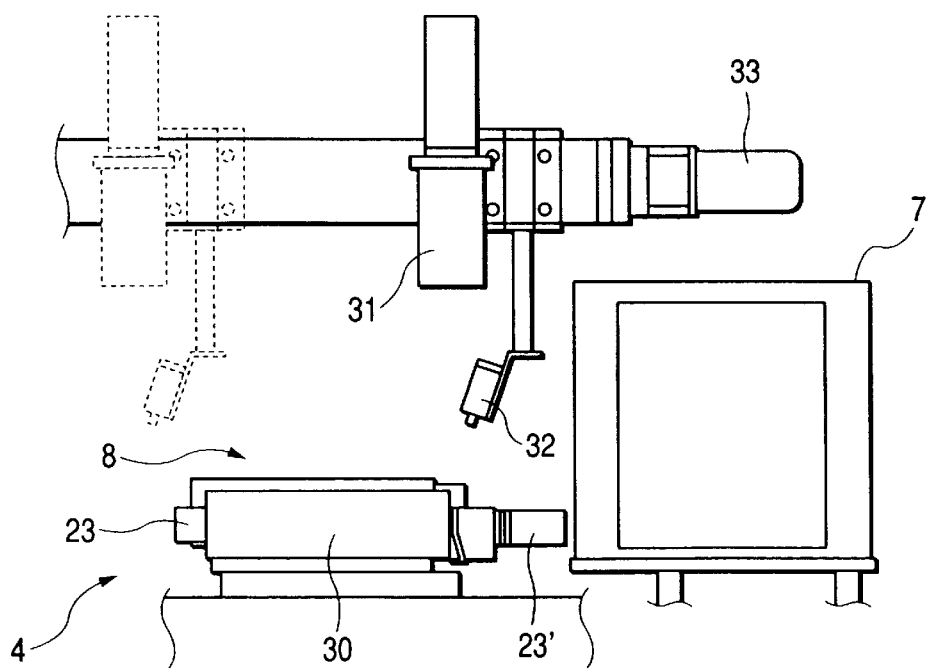
FIG. 2 shows an explanatory view showing inspection CCD cameras in a wafer positioning position.

Above the wafer positioning position 8, as shown in FIG. 2, two CCD cameras 31 are disposed so as to be put on top of each other in the front/rear direction of the paper of FIG. 2 (only the front one is shown in FIG. 2), and illuminators 32 directed onto the wafer 49 are provided below the CCD cameras 31. The CCD cameras 31 are made movable above the wafer positioning position 8 on the work driving mechanism 4 and in a direction parallel to the work driving mechanism 4 (in an X-axis direction) by a motor 33.

The work driving mechanism 4 is provided with a wafer stage 30. Driving mechanisms for two axes, that is, the X-axis (left/right direction in FIG. 1) and the Θ-axis (rotational direction) are provided for driving the wafer stage 30. The Θ-axis driving mechanism is adopted to play a main role of positioning the work, while the X-axis driving mechanism plays a role of moving and positioning the work.

The wafer stage 30 can be moved/stopped among/in the wafer positioning position 8, a flux transfer position 11 and a ball mount position 20, by the X-axis driving mechanism. Incidentally, the wafer stage 30 is provided with two CCD cameras 23 and 23' for observing a transfer head 13 and the mount head 25. The CCD cameras 23 and 23' play the role of the first optically recognizing means according to the present invention.

Figure 5:
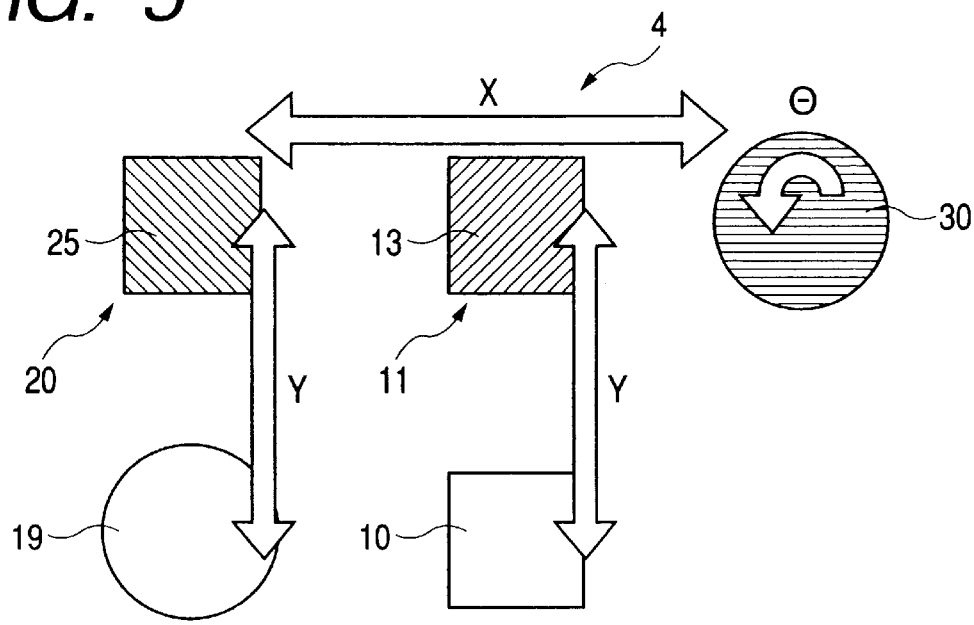
FIG. 5 shows an explanatory view of a first embodiment, showing the relationship of three positioning axes.

In the embodiment, as shown in FIG. 5, the Y-axis driving mechanism of the transfer head 13 and the Y-axis driving mechanism of the mount head 25 are provided in parallel with each other in the Y-axis direction (up-down direction indicated by an arrow in FIG. 5) intersecting the X-direction (left-right direction indicated by an arrow in FIG. 5) of the work driving mechanism 4.

The ball mount apparatus according to this embodiment is provided with an operation unit (not shown) and a control unit (not shown). The operation unit carries out an operation for obtaining the quantity of a relative positional gap between one example of the transfer head 13 shown in FIG. 9 and the work from the above-mentioned result of recognizing the position of the work with the CCD camera 31 and the result of recognizing alignment marks 117 of the head with the CCD cameras 23 and 23'. The control unit gives instructions to move or rotate, to driving mechanisms for driving respective axes (Y-, X- and Θ-axes) of the head and the work on the basis of the result of the operation unit. Incidentally, transfer heads 13 shown in FIGS. 13 and 19 do not have the alignment marks 117. These heads are used as another example according to the present invention, however, the alignment mark 117 can be applied to also these transfer heads.

The flux transfer portion 2 is constituted by the transfer head 13, a driving mechanism therefor, a flux supply unit 10 (flux reservoir) and the flux transfer position 11 on the work driving mechanism 4. A portion 12 for cleaning the transfer head 13 is provided on the course where the transfer head 13 moves.

Figure 9:
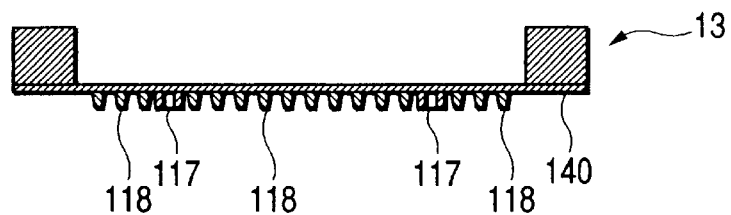
FIG. 9 shows an explanatory sectional view showing a lower surface of an example of a transfer head.

As shown in FIG. 9, the alignment marks (positioning marks) 117 are provided at four positions on a head lower surface 140 of the transfer head 13 corresponding to the outside of the wafer near its outline. Each of the alignment marks 117 is formed by providing a 0.3 mm diameter recess portion at the center of a 10 mm diameter protrusion. The protrusion is produced of the same material and in the same process as a flux transferring protrusion 118 is. Incidentally, the alignment marks 117 may be formed at portions on the head lower surface 140 of the transfer head 13 corresponding to the positions in the inside of the wafer but near its outline where no flux transferring protrusion 118 exists.

Figure 3:
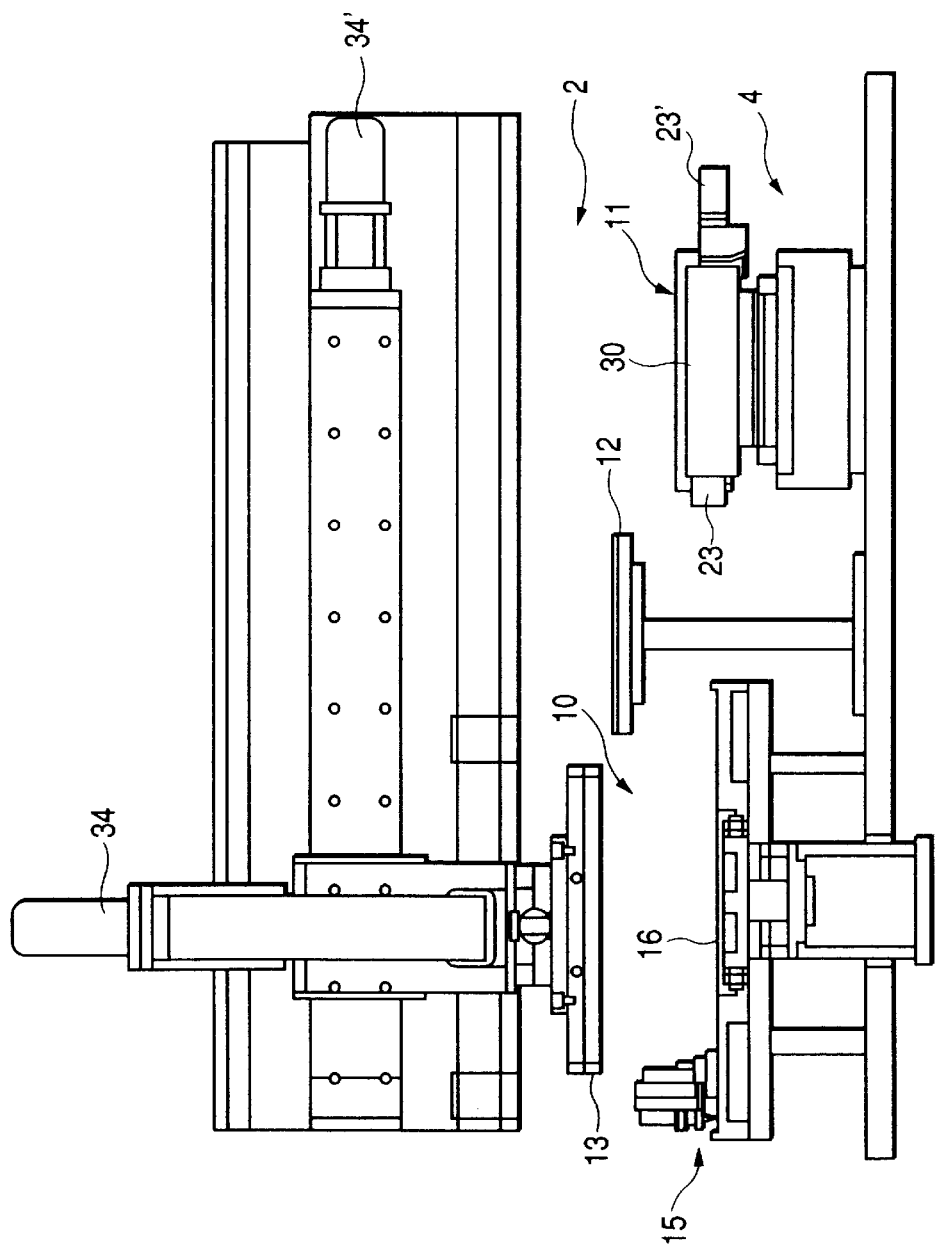
FIG. 3 shows a side view of a flux transfer portion.

As shown in FIG. 3, the transfer head 13 of the flux supply unit 10 is provided with two axis driving mechanisms, that is, a Y-axis driving mechanism reciprocating between the flux supply unit 10 and the flux transfer position 11 on the work driving mechanism 4, and a Z-axis (lifting axis) driving mechanism. In FIG. 3, the reference numeral 34 represents a Z-axis driving motor for the transfer head 13, and the reference numeral 34' represents a Y-axis driving motor. Here, the Y-axis driving mechanism playing the role of moving the transfer head 13 is also used for positioning the transfer head 13 and the work.

Figure 19:
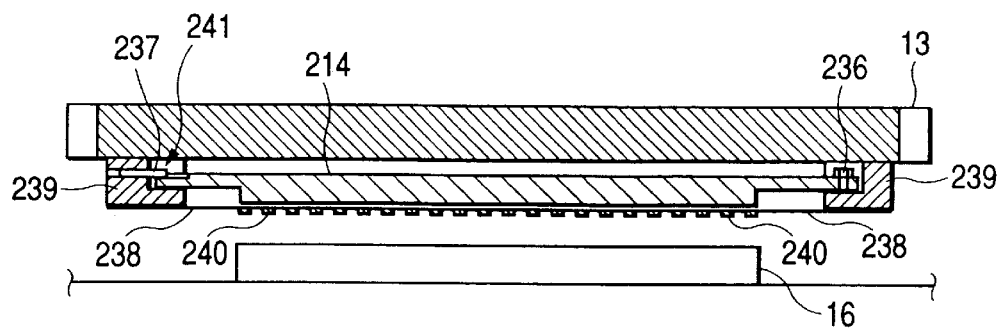
FIG. 19 shows an explanatory sectional view showing a state where a transfer head and a flux supply portion are in no contact with each other.
Figure 20:
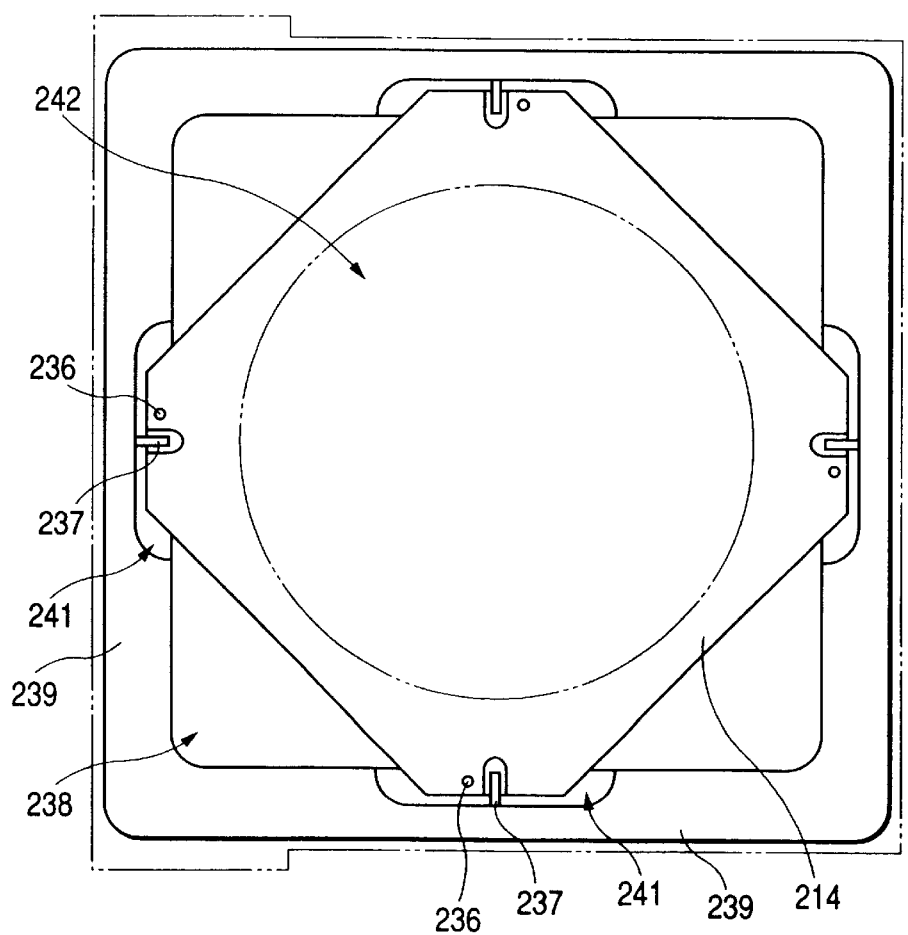
FIG. 20 shows a plan view showing a position where a balance plate is attached.
Figure 21:
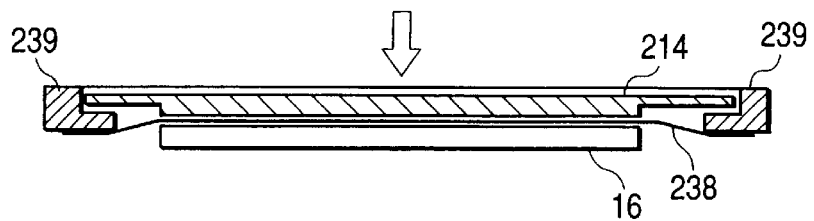
FIG. 21 shows an explanatory sectional view showing a state where the transfer head and the flux supply portion are in contact with each other.
Figure 22:
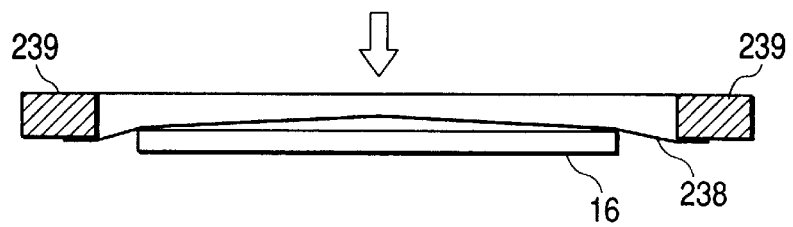
FIG. 22 shows an explanatory sectional view showing a state where a screen is bent.
Figure 23:
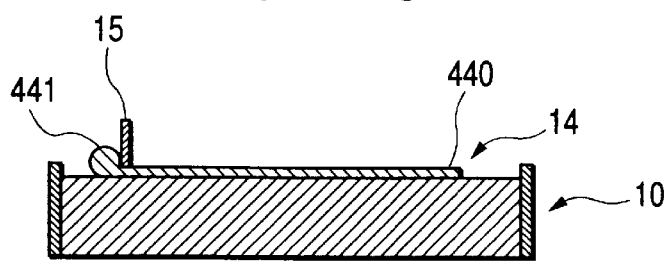
FIG. 23 shows a sectional view of a background-art flux reservoir.
Figure 24:
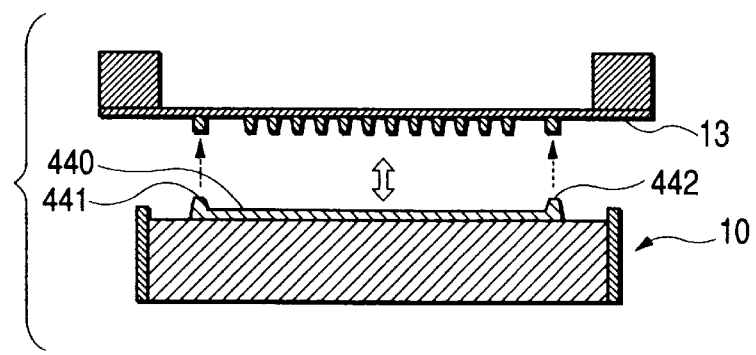
FIG. 24 shows an explanatory view of background-art flux transfer.

As aforementioned, another example of the transfer head 13 is shown in FIGS. 19 to 21. The transfer head 13 is constituted by a screen 238 which is strained, with a tension, over a frame 239 on the lower surface of the transfer head 13. The screen 238 is provided with a large number of transfer protrusions 240 corresponding to a pad pattern and looking downward. Flux of the flux supply portion (stage) 16 is supplied to the transfer protrusions 240, so that the flux is transferred to a work after the transfer head 13 is moved.

The frame 239 is rectangular as shown in FIGS. 19 and 20 on the top of the frame 239, four mounting grooves 241 for mounting a balance plate 214 are provided in the central insides of the respective sides of the rectangular frame 239. The balance plate (weight) 214 is disposed in the mounting grooves 241. This balance plate 214 prevents the screen 238 from being bent at its center portion owing to the weight of the balance plate 214 as shown in FIG. 21 when the transfer head 13 pressed onto the flux supply portion 16. Incidentally, air pressure may be used instead of the balance plate 214.

As shown in FIGS. 19 and 20, detachment prevention protrusions 237 are provided at four portions on the frame 239 above the balance plate 214 so that the balance plate 214 can move up and down in the transfer head 13. In addition, height adjustment screws 236 for separating the balance plate 214 slightly upward from the surface of the screen 238 which is in a no-load state are provided at four portions on the balance plate 214.

The height adjustment screws 236 are provided to adjust the lower limit position of the balance plate 214. The height of the balance plate 214 is adjusted by the projecting quantity of the lower end portions of the height adjustment screws 236 from the lower surface of the balance plate 214. As a result, the balance plate 214 gives no force to the screen 238 in a no-load state, but urges the screen 238 downward when an upward load is given to the screen 238. Since the balance plate 214 gives no energy to the screen 238 in a no-load state, the tension life of the screen 238 is prevented from being shortened. Incidentally, 242 designates a flux transfer area.

Figure 12:
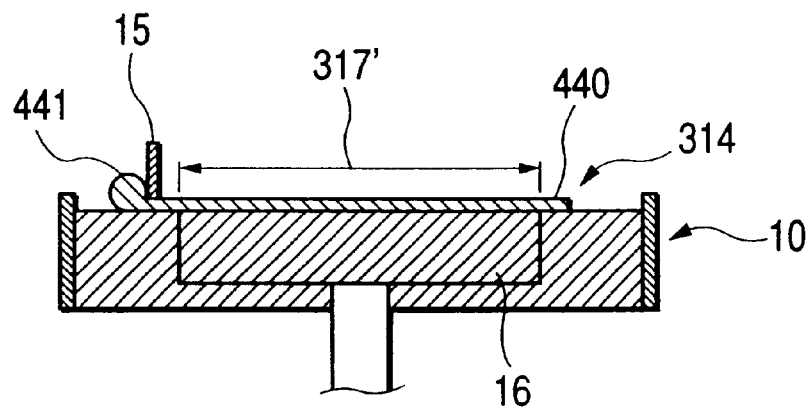
FIG. 12 shows a sectional view showing a flux reservoir.
Figure 13:
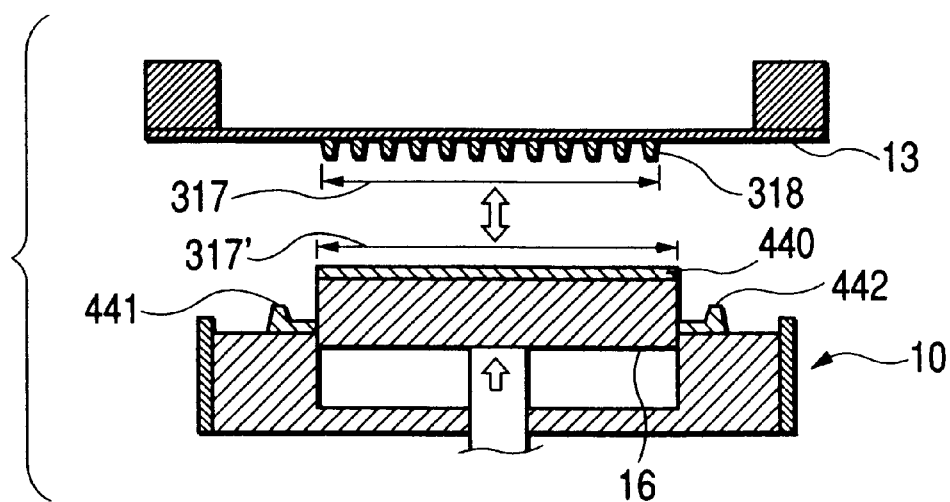
FIG. 13 shows an explanatory sectional view showing the relationship between a stage and a transfer head when the stage is lifted up.

As shown in FIGS. 12 and 13, a flux reservoir 10 as the flux supply unit is provided with a flux reserving space 314 having a flat supply area 317' for transferring flux, and a squeegee 15 as a flat flux smoothing portion for smoothing a flux surface in the supply area 317' so that the flux has a uniformly fixed thickness.

The supply area 317' in the flux reserving space 314 is formed by a stage 16 as a flux supply portion corresponding to a flux transfer area 317 of the transfer head 13. The stage 16 is set to be substantially as large as the transfer area 317 of the transfer head 13, and to be substantially parallel with the transfer area 317 as shown in FIG. 13. The stage 16 is made movable up/down. To transfer flux to the transfer head 13, the stage 16 is lifted up/down by a very small distance by a not-shown servo motor, a cylinder, or the like, while the angle of the flux surface of the supply area 317' is kept, that is, while the flux surface of the supply area 317' is kept substantially parallel with the transfer area 317 of the transfer head 13. As another embodiment, the flux reserving space 314 except the stage 16 may be moved down so that the stage 16 can be located above the reserving space 314. Incidentally, not transfer pins but a transfer stamp 318 is used as the transfer head 13 in this embodiment as shown in FIG. 13.

The ball mount portion 3 is constituted by a mount head 25, a driving mechanism therefor, a ball supply unit 19, a ball mount position 20 on the work driving mechanism 4, a surplus ball removing unit 21 disposed between the ball supply unit 19 and the ball mount position 20, a ball suction error inspection unit, and a ball discharge unit 24 which proceeds under the mount head 25 if surplus balls are detected by the ball suction error inspection unit.

Figure 10:
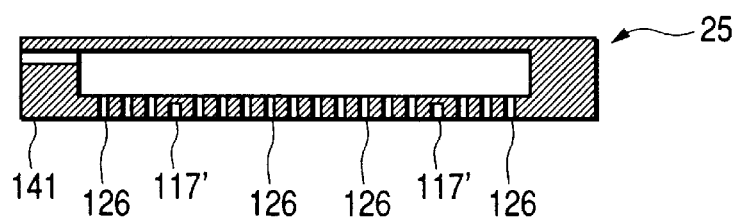
FIG. 10 shows an explanatory sectional view showing a lower surface of an example of a mount head.
Figure 11:
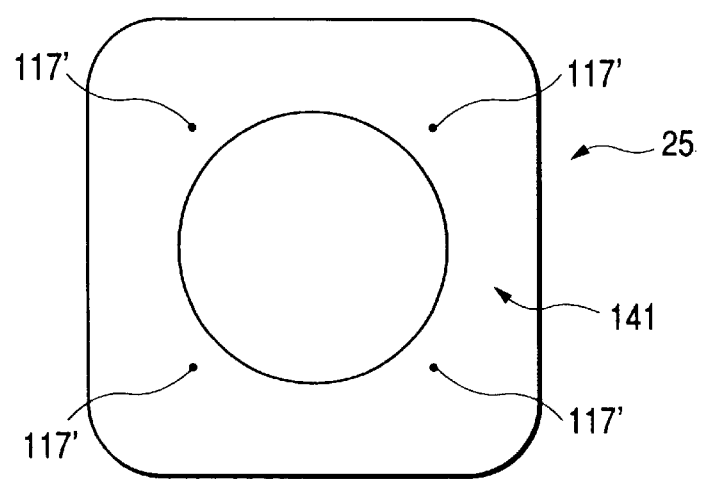
FIG. 11 shows an explanatory view showing alignment marks on the lower surface of the mount head in FIG. 10.

As shown in FIGS. 10 and 11, alignment marks 117' are provided at four portions on a head lower surface 141 of the mount head 25 corresponding to four positions in the outside of the wafer but near its outline where no suction hole 126 exists. Each of the alignment marks 117' is formed of a 0.3 mm diameter recess portion. Incidentally, the alignment marks 117' may be formed at portions on the head lower surface 141 of the mount head 25 corresponding to the positions in the inside of the wafer but near its outline where no suction hole 126 exists. Mount heads shown in FIGS. 15 to 18 do not have the alignment mark 117'. However, the alignment mark 117' can be applied to also these mounted heads.

Further, aforementioned other three examples of mount heads 25 and 26 shown in FIGS. 15 to 18 are explained. In the mount head 26 shown in FIGS. 15 and 16, a punching metal 43 which is to be a support plate according to the present invention, a support plate 41 constituted by a fine net which is to be a gas conducting permeable member according to the present invention, and a vacuum plate 40 provided with very small suction holes 46 for sucking solder balls 47 are attached integrally with the lower surface of the mount head 26 by a plate holder 44. Incidentally, the vacuum plate 40 and the support plate 41 are held by the plate holder 44 in a free state with a fixed clearance.

Figure 15:
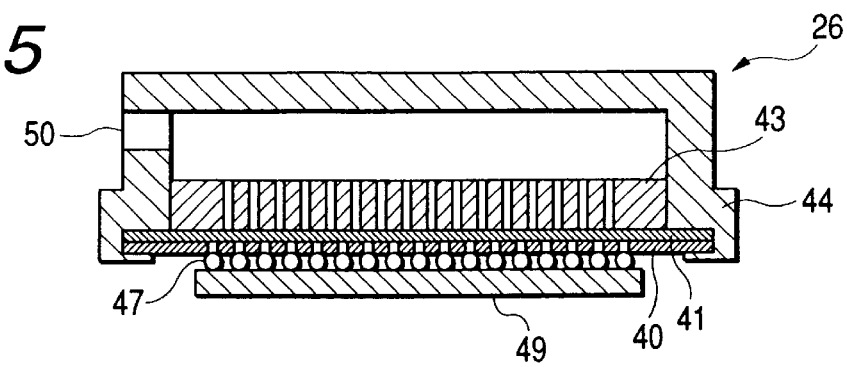
FIG. 15 shows a sectional view showing a state where another example of a mount head is used.
Figure 16:
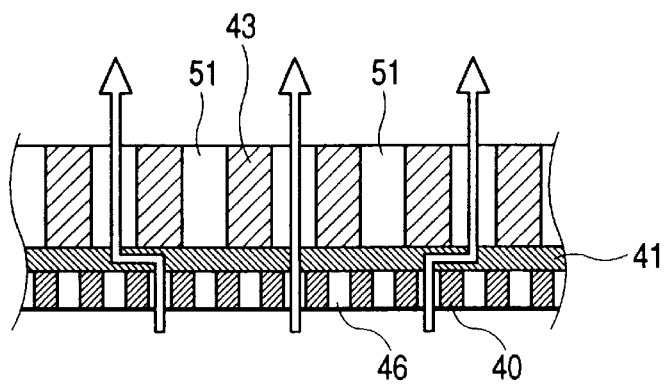
FIG. 16 shows an explanatory expanded sectional view of a lower portion of the mount head in FIG. 15.

As shown in FIGS. 15 and 16, the punching metal 43 as a gas-conducting path forming member has gas conducting paths 51 which do not correspond to the suction holes 46 of the vacuum plate 40. The gas conducting paths 51 are formed to be 3.8 mm in hole diameter and 5 mm in pitch. The punching metal 43 is to support the support plate 41 against external force so as to prevent the vacuum plate 40 from bending due to negative pressure at the time of sucking the solder balls 47, reaction force from the wafer 49, or other reasons. A support member having a honeycomb structure may be used instead of the punching metal 43.

The vacuum plate 40 which is 0.1 mm thick and in which a large number of suction holes 46 for sucking the solder balls 47 have been made by etching is formed of stainless. In this embodiment, resin coating is given to the vacuum plate 40 so as to prevent the edge portions of the suction holes 46 from damaging the solder balls 47.

The support plate 41 is disposed between the vacuum plate 40 and the punching metal 43 as shown in FIGS. 15 and 16. The support plate 41 is formed by pasting a high-tension resin net as a gas conducting permeable member onto a center opening portion of a frame in which a stainless plate 0.15 mm thick is opened at its center to be large enough to cover a suction area of the vacuum plate 40. A metal net or a porous material may be used instead of the high tension resin net. The support plate 41 makes a layer in which the air flows between the punching metal 43 and the vacuum plate 40 in order to produce a uniform ball suction state all over the suction area of the vacuum plate 40.

Figure 17:
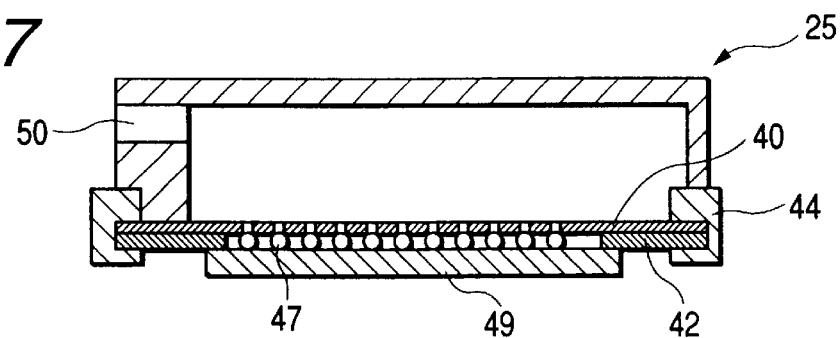
FIG. 17 shows a sectional view showing a state where still another example of the mount head is used.

In the mount head 25 shown in FIG. 17, the vacuum plate 40 provided with very small suction holes 46 for sucking the solder balls 47, and a spacer 42 provided on an outer area of a suction area of the vacuum plate 40 for sucking the solder balls 47 are attached integrally with the lower surface of the mount head 26 by a plate holder 44.

The spacer 42 is provided outside the suction area of the vacuum plate 40 so as to project under the mount head. As shown in FIG. 17, the thickness of the spacer 42 is determined in accordance with the diameter of the solder balls 47. Preferably the spacer 42 has such a size that the solder balls 47 are pressed slightly by a substrate and the mount head 25 when the solder balls 47 are mounted on the substrate.

In this embodiment, the spacer 42 has a thickness of 0.25 mm while the solder balls 47 have a diameter of 0.3 mm. The spacer 42 prevents the solder balls 47 from being dented when the solder balls 47 are mounted.

Figure 18:
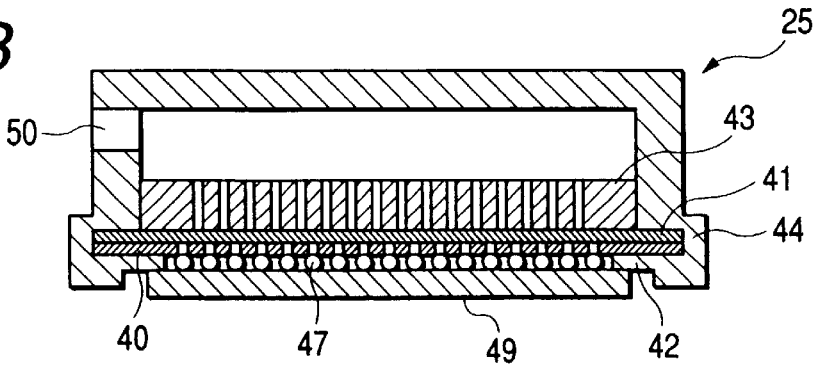
FIG. 18 shows a sectional view showing a state where a further still another example of the mount head is used.

The mount head 25 shown in FIG. 18 has both the elements of the mount heads 26 and 25 shown in FIGS. 15 and 17. A support plate 41, a vacuum plate 40 and a spacer 42 integrated by a plate holder 44 so as to extend along the lower surface of a punching metal 43 are attached to a lower portion of the mount head 25.

Figure 4:
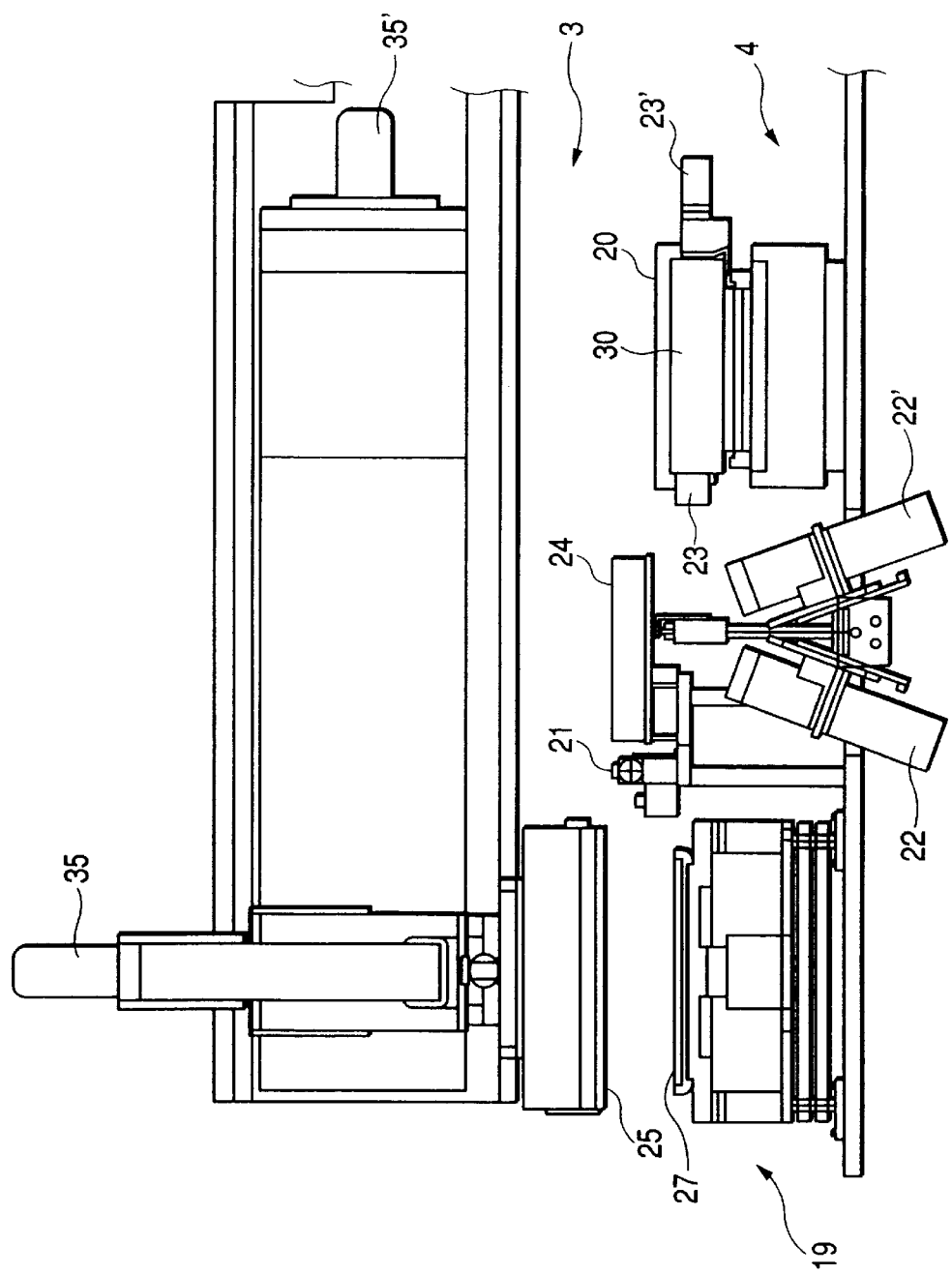
FIG. 4 shows a side view of a ball mount portion.

As shown in FIG. 4, the mount head 25 is provided with two axis driving mechanisms, that is, a Y-axis driving mechanism reciprocating between the ball supply unit 19 and the ball mount position 20 on the work driving mechanism 4, and a Z-axis (lifting axis) driving mechanism. In FIG. 4, the reference numeral 35 represents a Z-axis driving motor, and 35' represents a Y-axis driving motor. Here, the Y-axis driving mechanism playing the role of moving the mount head 25 is also used for positioning the mount head 25 and the work.

The ball supply unit 19 is configured like a parts feeder. A vibrator is attached to a ball tray 27 for supplying the solder balls 47 to the mount head 25. When the vibrator vibrates, the solder balls 47 jump up obliquely and move to make a round in the ball tray 27 if the solder balls 47 are observed from above.

A supply port 28 for supplying the solder balls 47 from a ball stocker (not shown) into the ball tray 27 is disposed above the ball tray 27 movably forward and backward. A sensor 29 for detecting the quantity of remaining balls in the ball tray 27 is attached to the front end of the supply port 28. If the sensor 29 detects insufficiency of remaining balls, a predetermined quantity of solder balls 47 are supplied from the ball stocker. The supply port 28 is configured to take refuge outside the ball tray 27 so as to avoid interfering with the mount head 25 when the solder balls 47 are sucked.

The surplus ball removing unit 21 is a removing nozzle for removing surplus balls sucked on the mount head 25.

The ball suction error inspection unit detects suction errors such as missing balls, extra balls (surplus balls), or the like, and mount errors such as remaining balls on the mount head 25 after mounting balls, through four line CCD cameras 22 and 22'.

Description will be made below about the procedure for operating the solder ball mount apparatus using the mount head 25, the transfer head 13, a work and head driving mechanism, and the flux reservoir 10 according to the present invention. Hereinafter, operations using the transfer heads 13 shown in FIGS. 9, 13, 19, and the mount heads 25 shown in FIGS. 10, 11, 18 will be explained in one procedure in parallel. Of course, these members are separately used in the actual ball mount procedure. However, subject technical matters of each units can be used to be combined in one ball mount apparatus.

First, one wafer 49 at a time is supplied from the supply wafer cassette 5 onto the wafer stage 30, which is located in the wafer positioning position 8, by the robot 9. On the wafer stage 30, when the wafer 49 is supplied, vacuum suction is commenced from a hole in the upper surface of the wafer stage 30 by a not-shown blower so that the wafer 49 is held on the wafer stage 30.

A positioning mark or a wiring pattern on the wafer 49 held on the wafer stage 30 is read by the two CCD cameras 31 as the second optically recognizing means disposed above the wafer positioning position 8 so that the position of the wafer 49 on the wafer stage 30 is recognized. Then, data is sent to a not-shown operation unit. The wafer stage 30 which has finished recognizing the position of the wafer 49 is moved to the flux transfer position 11. At this time, the wafer stage 30 is stopped in a position taking account of an X-axis gap stored at the time of positioning the wafer.

Figure 14:
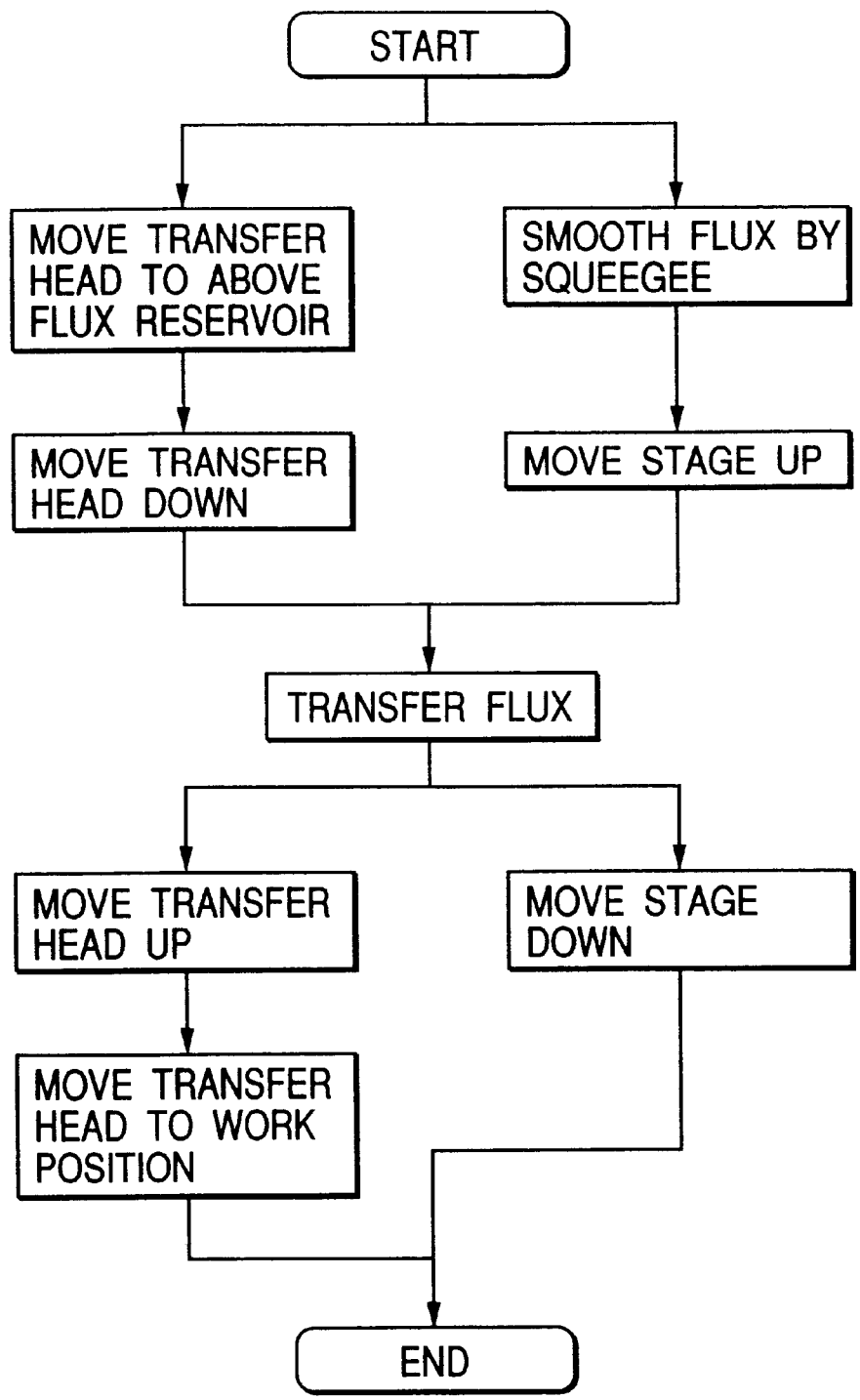
FIG. 14 shows a flow chart of a flux transfer procedure.

In the flux transfer portion 2, the transfer head 13 is moved above the flux reservoir 10 as shown in the flow chart of FIG. 14. At this time, the flux surface is smoothed by the squeegee 15 in the flux reservoir 10. After that, the transfer head 13 is moved down while the stage 16 is lifted up. At a point of time when the transfer head 13 and the stage 16 abut against each other so as to be applied with a load above predetermined pressure, it is concluded that transferring flux to the transfer head 13 is completed. Thus, the transfer head 13 is stopped from moving down, and lifted up. At the same time, the stage 16 is moved down.

By the way, now explanation is provided for a case that the transfer head 13 and the flux supply portion (stage) 16 shown in FIGS. 19 to 21 are used in the flux supply unit 10.

After the flux surface is smoothed by the squeegee 15, and the transfer head 13 is moved down so that the transfer protrusions 240 of the screen 238 abut against the flux supply portion 16. When an upward load is given from the flux supply portion 16 to the screen 238, the screen 238 wants to bend upward. At this time, however, the balance plate 214 is located slightly above the screen 238 so that the screen 238 receives the weight of the balance plate 214. Thus, the screen 238 produces no bending phenomenon, and applies flux to the flux transfer protrusions 240 uniformly. After completion of supplying flux, the transfer head 13 stops moving down, and moves up.

After that, the transfer head 13 is moved to the flux transfer position 11. Hereupon, if the transfer head 13 having the alignment marks 117 shown in FIG. 9 is used as a transfer head, the alignment marks 117 on the head lower surface 140 of the transfer head 13 are recognized by the CCD cameras 23 and 23' provided on the wafer stage 30 as the first optically recognizing means. The operation unit carries out an operation for obtaining the quantity of a relative positional gap between the two on the basis of the result of this recognition as well as the data of the position of the wafer recognized previously.

In response to the result of the aforementioned operation, the control unit gives instructions to make the positions of the wafer and the transfer head 13 coincident with each other, to one axis (Y-axis) of the transfer head 13 and two axes (X- and Θ-axes) of the wafer stage 30. On the basis of the instructions, the Y-axis of the transfer head 13 and the X- and Θ-axes of the wafer stage 30 are actuated to perform positioning of the transfer head 13 and the wafer stage 30.

After positioning, the transfer head 13 is moved down. At a point of time when the load on the Z-axis driving motor 34 for the transfer head 13 has reached a predetermined value, it is concluded that transferring flux to the wafer is completed, and the transfer head 13 is lifted up. After lifted up, the transfer head 13 returns to the flux reservoir 10, and the wafer stage 30 moves to the ball mount position 20. Incidentally, every time when necessary cycles has passed, the transfer head 13 is moved to a cleaning portion 12 and brought into contact with the cleaning portion 12 so as to remove flux remaining on the transfer head 13.

Now explanation is given for a case that the mount head 25 shown in FIG. 18 is used for suction of solder balls 47. The mount head 25 moves down from above the ball supply unit 19 and stops in a designated position. The inner space of the mount head 25 is decompressed through an exhaust port 50 by a not-shown blower motor so that the pressure of the mount head 25 is reduced. With the reduction of the pressure of the mount head 25, the vacuum plate 40 and the support plate 41 are brought into tight contact with the punching metal 43. Even in this state, as shown in the arrow of FIG. 16, suction is performed through the meshes of the high-tension resin net of the support plate 41 put between the punching metal 43 and the vacuum plate 40 because the punching metal 43 is provided with a large number of gas conducting paths 51. Thus, vacuum pressure is produced in the respective suction holes 46 of the vacuum plate 40 so that the solder balls 47 are sucked in the respective suction holes 46.

At a point of time when the internal pressure of the mount head 25 has become lower than predetermined pressure, it is concluded that the suction has been completed, and the mount head is lifted up. After that, surplus balls are removed by the surplus ball removing unit 21, and the mount head 25 is moved to the ball suction error inspection unit.

When there are ball suction errors, if the errors are missing balls, the mount head 25 is moved to the ball supply unit 19 again, and repeats the sucking operation. If there are surplus balls, the ball discharge unit 24 proceeds under the mount head 25. Then, the mount head 25 discharges all the sucked balls into the ball discharge unit 24, thereafter moves to the ball supply unit 19 again and repeats the sucking operation.

If there is no abnormality, the mount head 25 is moved to the ball mount position 20. From the following procedure, an explanation is given for the mount head 25 shown in FIGS. 10 and 11 instead of the mount head 25 shown in FIG. 18.

In the ball mount position 20, the alignment marks 117' on the lower surface 141 of the mount head 25 are recognized by the CCD cameras 23 and 23' provided on the wafer stage 30 as the first optically recognizing means. The operation unit carries out an operation for obtaining the quantity of a relative positional gap between the mount head 25 and the wafer on the basis of the result of this recognition as well as the data of the position of the wafer recognized previously.

In response to the result of the aforementioned operation, the control unit gives instructions to make the positions of the wafer and the mount head 25 coincident with each other, to one axis (Y-axis) of the mount head 25 and two axes (X- and Θ-axes) of the wafer stage 30. On the basis of the instructions, the Y-axis of the mount head 25 and the X- and Θ-axes of the wafer stage 30 are actuated to perform positioning of the mount head 25 and the wafer stage 30.

After positioning, the mount head 25 is moved down. When the spacer 42 on the lower surface of the mount head 25 abuts against the wafer 49 so that the load detected by a not-shown load sensor reaches a predetermined value, the mount head 25 stops moving down.

The explanation will return to the mount head 25 shown in FIG. 18 for mounting solder balls. At this point of time, if the mount head 25 shown in FIG. 18 is used, the solder balls 47 are put between the mount head 25 and the wafer 49. Here the blower is stopped so that the pressure in the mount head 25 is exposed to the atmospheric pressure. At this moment, the support plate 41 and the vacuum plate 40 receive force in a direction to leave the punching metal 43. By this force, the solder balls 47 are separated from the mount head 25 surely, and mounted on the wafer 49. The mount head is thereafter lifted up.

The wafer stage 30 on which the solder balls have been mounted returns to the wafer positioning position 8. At this time, the mounting condition of the solder balls on the wafer is inspected through the CCD cameras 31 moved to a ball mount inspection position beforehand. The CCD cameras 31 have their primary object to recognize the position of the work as the second optically recognizing means. In this embodiment, they also play the role of inspecting the mounting condition of the solder balls on the wafer.

At this time, the CCD cameras 31 are in stoppage and scan the whole surface of the wafer 49 by the movement of the wafer stage 30. As a result of the inspection, the wafer is inserted, by the robot 9, to the outgoing wafer cassette 6 if the mount is good, while it is inserted to the reject wafer cassette 7 if the mount is not good.

Figure 6:
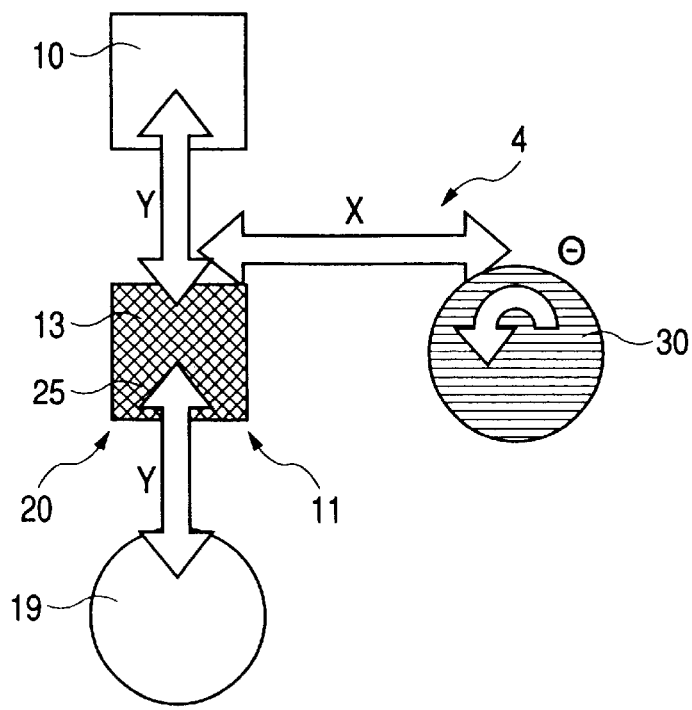
FIG. 6 shows an explanatory view of a second embodiment showing similar relationship.

FIG. 6 is an explanatory view of another embodiment, showing the relationship of three axes for positioning the work and the head. In the solder ball mount apparatus according to the second embodiment, in the work driving mechanism 4, the transfer head 13 and the mount head 25 are provided in series positions on the Y-axis, and the flux transfer position 11 and the ball mount position 20 are disposed in one and the same position. In this embodiment, the flux supply unit 10 and the ball supply unit 19 are disposed above and below, respectively, on the Y-axis in FIG. 6 so as to hold the work driving mechanism 4 therebetween.

The Y-axis driving mechanism allows the transfer head 13 to move between the flux supply unit 10, which is disposed on the Y-axis and above the work driving mechanism 4 in FIG. 6, and the flux transfer position 11. The Y-axis driving mechanism allows the mount head 25 to move between the ball supply unit 19, which is disposed on the Y-axis and below the work driving mechanism 4 in FIG. 6, and the ball mount position 20.

In the flux transfer position 11, positioning is performed by the X-axis movement (left/right movement in FIG. 6) of the wafer stage 30, the Θ-axis rotation of the wafer stage 30, and the Y-axis movement (up/down movement in FIG. 6) of the transfer head 13 so that the positional relationship between the wafer on the wafer stage 30 and the transfer head 13 is adjusted. After the positioning, flux is transferred to the wafer.

Next, the thus adjusted position becomes the ball mount position 20. In the ball mount position 20, positioning is performed by the X-axis movement of the wafer stage 30, the Θ-axis rotation of the wafer stage 30, and the Y-axis movement of the mount head 25, so that the positional relationship between the wafer on the wafer stage 30 and the mount head 25 is adjusted. After the positioning, solder balls sucked on the lower surface of the mount head 25 are mounted on the wafer.

Figure 7:
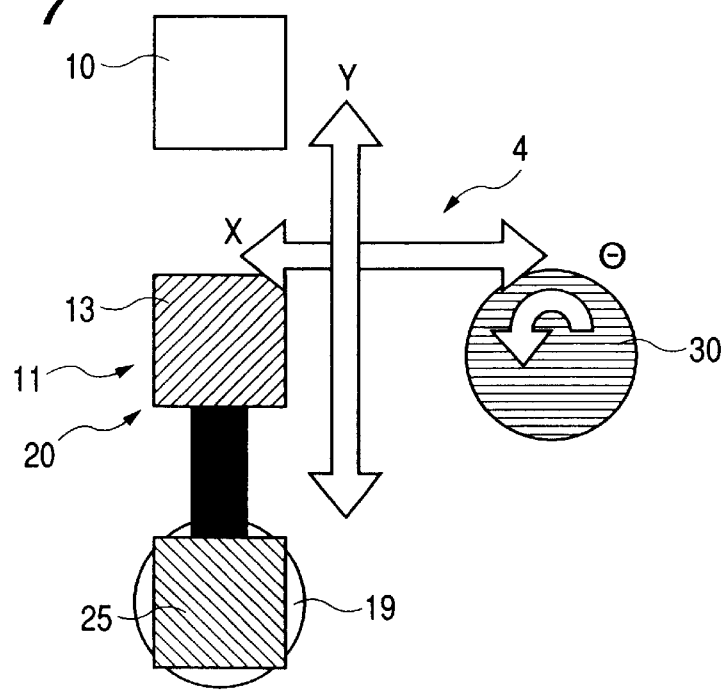
FIG. 7 shows an explanatory view of a third embodiment showing similar relationship.

FIG. 7 is an explanatory view of a still another embodiment, showing the relationship of three axes for positioning the work and the head. In a solder ball mount apparatus according to this embodiment, in a work driving mechanism 4, a transfer head 13 and a mount head 25 are provided in serial connection with each other on a Y-axis (in the up/down direction in FIG. 7), so that both transferring flux and mounting solder balls are achieved by the same driving mechanism. A flux supply unit 10 and a ball supply unit 19 are disposed above and below, respectively, on the Y-axis in FIG. 7 so as to hold the work driving mechanism 4 therebetween.

Also in this embodiment, a flux transfer position 11 and a ball mount position 20 are set in one and the same position. While the flux transfer head 13 engages in transferring flux to the wafer as shown in FIG. 7, the mount head 25 engages in sucking solder balls in the ball supply unit 19. Though not shown, the transfer head 13 engages in being supplied with flux in the flux supply unit 10 while the mount head 25 engages in mounting the solder balls on the wafer.

In this embodiment, the Y-axis driving mechanism allows the transfer head 13 to move between the flux supply unit 10, which is disposed on the Y-axis and above the work driving mechanism 4 in FIG. 7, and the flux transfer position 11. In the flux transfer position, positioning is performed by the X-axis movement (left/right movement in FIG. 7) of the wafer stage 30, the Θ-axis rotation of a wafer stage 30, and the Y-axis movement (up/down movement in FIG. 7) of the transfer head 13, so that the positional relationship between the wafer on the wafer stage 30 and the transfer head 13 is adjusted. After the positioning, flux is transferred to the wafer.

In this embodiment, the Y-axis driving mechanism allows the mount head 25 to move between the ball supply unit 19, which is disposed on the Y-axis and below the work driving mechanism 4 in FIG. 7, and the ball mount position 20. After flux has been transferred in the flux transfer position 11, the same position becomes the ball mount position 20. In the ball mount position 20, positioning is performed by the X-axis movement of the wafer stage 30, the Θ-axis rotation of the wafer stage 30, and the Y-axis movement of the mount head 25, so that the positional relationship between the wafer on the wafer stage 30 and the mount head 25 is adjusted. After the positioning, solder balls sucked on the lower surface of the mount head 25 are mounted on the wafer.

Figure 8:
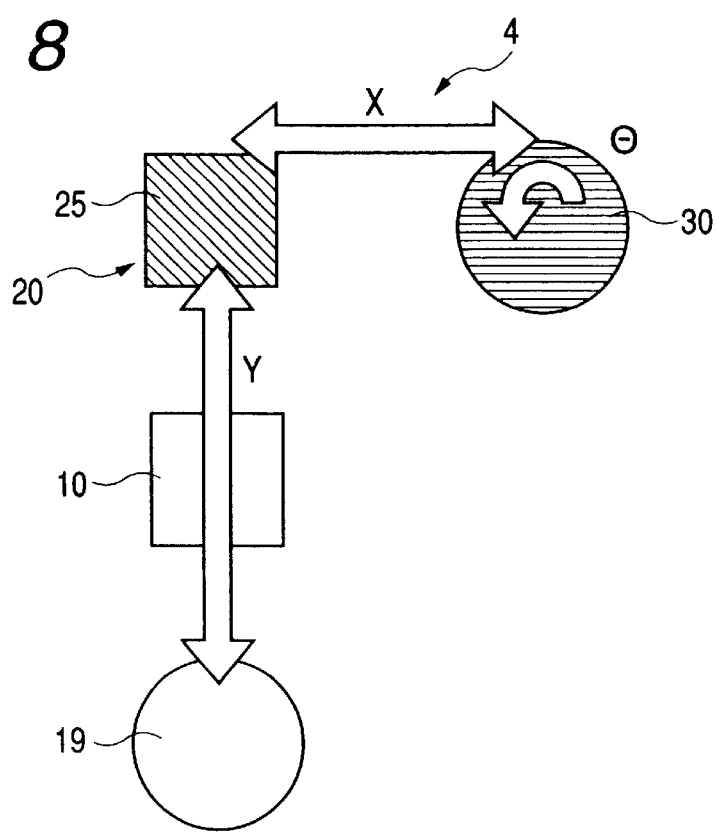
FIG. 8 shows an explanatory view of a fourth embodiment showing similar relationship.

FIG. 8 is an explanatory view of a still another embodiment, showing the relationship of three axes for positioning the work and the head. In a solder ball mount apparatus according to the fourth embodiment, there is no flux transfer head, and only a mount head 25 is provided on a Y-axis with respect to a work driving mechanism 4. Flux is supplied directly to solder balls sucked on a mount head 25, and the solder balls are mounted.

In this embodiment, a flux supply unit 10 and a ball supply unit 19 are disposed above and below on the Y-axis, respectively. That is, the mount head 25 sucks solder balls in the ball supply unit 19, thereafter moves to a flux supply unit 10 (from the lower to the upper in FIG. 8), and transfers flux only to the solder balls.

After that, the mount head 25 moves to a ball mount position 20 (from the lower to the upper in FIG. 8). In the ball mount position 20, positioning is performed by the X-axis movement of a wafer stage 30, the Θ-axis rotation of the wafer stage 30, and the Y-axis movement of the mount head 25, so that the positional relationship between the wafer and the mount head 25 is adjusted. After the positioning, the solder balls sucked on the lower surface of the mount head 25 are mounted on the wafer.

According to the present invention, a straight-line axis which is substantially in a horizontal direction is provided as a head driving axis, and a straight-line axis in a direction intersecting the head driving axis and a rotational axis are provided as work driving axes, the three axes are driven to adjust the positional relationship between the work and the head. Accordingly, excessive driving axes are reduced in a solder ball mount apparatus as a whole so that the driving mechanism can be simplified. As a result, it is possible to provide a solder ball mount apparatus in which factors of trouble are reduced.

According to the present invention, in a flux reservoir, a supply area in a flux reserving space is made substantially as large as a transfer area of a transfer head, and is made movable up relatively to the flux reserving space except the supply area while keeping substantial parallelism between a flux surface of the supply area and the transfer area of the transfer head. Accordingly, flux can be transferred to the transfer head without bringing flux protuberance portions close to the transfer head if a stage is lifted up synchronizingly with the transfer head being moved down. It is therefore possible to provide a flux reservoir and a flux transfer method in which flux does not adhere to any unexpected portion of a transfer head, so that transferring can be performed surely even if the flux reservoir is compact in size and transferring is very fine.

As is an effect of an embodiment, if a transfer stamp is used in the transfer head, the attachment cost (the price of parts) can be reduced in comparison with the case where transfer pins are used in the transfer head.

The present invention provides a head and work positioning apparatus and a positioning method comprising a head provided with alignment marks, first optically recognizing means for recognizing the alignment marks, second optically recognizing means for recognizing a position of a work, operation means for carrying out an operation for obtaining a quantity of a relative positional gap between the head and the work on the basis of the recognition results of the two optically recognizing means, and control means for giving movement instructions to driving mechanisms for respective axes of the head and the work on the basis of the result of the operation means. Accordingly, it is possible to satisfy the high positioning accuracy required with the tendency to make balls very small and mount a large quantity of balls in a lump.

Further, the first optically recognizing means is provided on a stage for moving and positioning the work so that the alignment marks of the head can be recognized with the driving mechanisms for driving the work. Accordingly, it is possible to recognize a transfer head or a mount head with a small number of driving mechanisms, so that it is possible to miniaturize a ball mount apparatus as a whole.

A background-art vacuum plate provided with a large number of ball suction holes was usually manufactured by using a thick material (resin, metal, or the like) to obtain required rigidity and machining with a spindle or the like to make the suction holes. However, such machining increased the cost if the number of the holes was especially large. In such a case, it was attempted to make the vacuum plate thinner. For example, it was proposed to form a mount head which was backed with a porous material. When the porous material was used, however, the loss in pressure was so large that large-sized decompression means was required. If the thickness of the porous material was reduced so as to lower the loss in pressure, there was a problem that the strength was insufficient.

However, according to the present invention, a mount head has a vacuum plate provided with a large number of suction holes for sucking balls; a gas-conducting path forming member having gas conducting paths which do not correspond to the suction holes of the vacuum plate, so as to support the vacuum plate against external force; and a gas conducting permeable member disposed in a vacuum plate suction area between the vacuum plate and the gas-conducting path forming member. Accordingly, even if a thin material is used for the vacuum plate or the gas conducting permeable member, the bottom can prevent the vacuum plate from bending due to negative pressure when solder balls are sucked, so that it is possible to ensure parallelism between a work and the vacuum plate. It is therefore possible to provide a mount head in which a large quantity of solder balls can be mounted accurately on the work.

Secondly, since a thin material can be used for the vacuum plate, the vacuum plate follows the work surface when the solder balls are mounted, so that the mount accuracy is enhanced. It is therefore possible to form the suction holes easily, and it is also possible to reduce the cost of parts. Further, since a thin material can be used for the gas conductive permeable member, large-sized decompression means is not required.

Thirdly, since the gas conducting permeable member is provided, a layer in which the air flows is formed between the gas-conducting path forming member and the vacuum plate. It is possible to provide a mount head in which a uniform ball suction state can be produced all over the suction area.

Further, since a spacer having thickness corresponding to the diameter of balls to be sucked is provided outside the suction area of the vacuum plate, it is possible to provide a mount head in which solder balls can be prevented from being dented when they are mounted.

According to the present invention, a transfer head has a screen which is provided with transfer protrusions at a lower surface of the screen and which is strained with a tension over a frame on a lower surface of the transfer head, wherein the transfer head further has means which gives no energy to the screen in a no-load state but urges the screen downward when an upward load is given to the screen, the means being provided above the screen. As a result, it is possible to provide a transfer head in which such a phenomenon that a screen is bent at its center portion is not produced even when the transfer head is pressed onto a flux supply portion. Accordingly, there does not appear a difference in flux adhering quantity between the center and the circumference of the transfer head, and hence the flux adhering quantity can be made uniform.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A work and ball mount head positioning apparatus to be provided in a ball mount apparatus, the work and ball mount head positioning apparatus moving a work and a ball mount head relatively to each other to perform positioning of said ball mount head and said work, comprising:

a ball mount head driving mechanism for driving the ball mount head substantially in a linear direction;

a ball tray and a ball mount position each being disposed along a moving path of the ball mount head, which extends in the linear direction;

a first work driving mechanism for driving the work, said first work driving mechanism extending in a direction intersecting said ball mount head driving mechanism at the ball mount position; and a second work driving mechanism for driving the work in a rotational direction on said first work driving mechanism, wherein said three driving mechanisms are driven so that a positional relationship between said work and said ball mount head is adjusted.

2. A work and ball mount head positioning apparatus according to claim 1, wherein said work is a whole wafer, and said ball mount head mounts balls on said wafer in a lump.

3. A work and ball mount head positioning apparatus according to claim 1, further comprising a flux transfer head.

4. A work and ball mount head positioning apparatus according to claim 1, further comprising a flux transfer head driving mechanism, wherein said ball mount head driving mechanism and said flux transfer head driving mechanism are located on one side of said first work driving mechanism while being extended substantially in parallel with each other.

5. A work and ball mount head positioning apparatus according to claim 1, further comprising a flux transfer head driving mechanism, wherein said ball mount head driving mechanism and said flux transfer head driving mechanism are located on both sides of said first work driving mechanism while being opposite to each other and located on a single linear line.

6. A work and ball mount head positioning apparatus according to claim 1, wherein said ball mount head driving mechanism drives a ball mount head for mounting balls on said wafer in a lump and a flux transfer head, alternatively.

7. A work and ball mount head positioning apparatus to be provided in a ball mount apparatus, the work and ball mount head positioning apparatus moving a work and a ball mount head relatively to each other to perform positioning of said ball mount head and said work, comprising:

a ball mount head driving mechanism for driving the ball mount head substantially in a linear direction;

a ball tray and a ball mount position each being disposed along a moving path of the ball mount head, which extends in the linear direction;

a first work driving mechanism for driving the work, said first work driving mechanism extending in a direction intersecting said ball mount head driving mechanism at the ball mount position;

a second work driving mechanism for driving the work in a rotational direction on said first work driving mechanism, wherein said three driving mechanisms are driven so that a positional relationship between said work and said ball mount head is adjusted; and a work supply unit disposed on a side of said first work driving mechanism to supply the work on said second work driving mechanism.

8. A work and ball mount head positioning apparatus to be provided in a ball mount apparatus for moving a work and a ball mount head relatively to each other, comprising:

a ball mount head driving device disposed on the ball mount apparatus for driving the ball mount head along a substantially linear moving path;

a ball tray and a ball mount position each being disposed along the moving path of the ball mount head on the ball mount apparatus;

a first work driving device for driving the work along a substantially linear moving path, which intersects the moving path of the ball mount head, said first work driving device disposed on the ball mount apparatus so as to intersect said ball mount head driving device at the ball mount position; and a second work driving device for driving the work in a rotational direction on said first work driving device, wherein said three driving devices are driven so that the work and the ball mount head are moved on the ball mount apparatus to achieve a desired positional relationship between the work and the ball mount head.

9. A wafer and ball mount head positioning apparatus, comprising:

a wafer supply portion that includes a wafer positioning mechanism;

a flux transfer portion that includes a transfer head, a flux driving mechanism for moving the transfer head to a flux transfer position, and a flux supply unit; and a work driving mechanism for receiving a wafer from the wafer positioning mechanism, the wafer being placed on a wafer stage on the work driving mechanism so that the wafer stage is movable in a rotational direction, and movable in a linear direction so as to be disposed in the flux transfer position and a ball mount position, sequentially.

* * * * *